United States Patent
Hashemi et al.

(10) Patent No.: US 9,899,341 B2
(45) Date of Patent: Feb. 20, 2018

(54) ANTENNA ON INTEGRATED CIRCUIT PACKAGE

(71) Applicant: Atmel Corporation, San Jose, CA (US)

(72) Inventors: Hassan Hashemi, Laguna Niguel, CA (US); Mamdouh Atia, Lake Forest, CA (US); Igor Radutnuy, Aliso Viejo, CA (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 15/213,320

(22) Filed: Jul. 18, 2016

(65) Prior Publication Data

US 2018/0019216 A1   Jan. 18, 2018

(51) Int. Cl.
| | |
|---|---|
| *H01Q 1/38* | (2006.01) |
| *H01L 23/66* | (2006.01) |
| *H01L 23/31* | (2006.01) |
| *H01L 23/522* | (2006.01) |
| *H01L 23/60* | (2006.01) |
| *H01L 23/00* | (2006.01) |
| *H01L 21/56* | (2006.01) |
| *H04B 1/3888* | (2015.01) |
| *H04B 1/3827* | (2015.01) |

(52) U.S. Cl.
CPC ............. *H01L 23/66* (2013.01); *H01L 21/56* (2013.01); *H01L 23/3107* (2013.01); *H01L 23/5226* (2013.01); *H01L 23/60* (2013.01); *H01L 24/46* (2013.01); *H04B 1/3833* (2013.01); *H04B 1/3888* (2013.01); *H01L 2223/6677* (2013.01); *H01L 2224/48091* (2013.01); *H01L 2924/19105* (2013.01)

(58) Field of Classification Search
CPC ......... H01L 23/66; H01L 21/56; H01L 23/60; H01L 24/46
USPC .......................................... 343/787
See application file for complete search history.

(56) References Cited

U.S. PATENT DOCUMENTS

2016/0007480 A1 *  1/2016  Yosui ..................... H05K 1/186
                                                                343/787

FOREIGN PATENT DOCUMENTS

WO   WO2014/185438 A1 *  5/2014  .............. H05K 3/30

* cited by examiner

*Primary Examiner* — Andrea Lindgren Baltzell
(74) *Attorney, Agent, or Firm* — Fish & Richardson P.C.

(57) ABSTRACT

An antenna on integrated circuit (IC) package is disclosed. In an embodiment, an IC package comprises: a substrate; a radio frequency (RF) transceiver attached to the substrate; mold compound encapsulating the substrate; a shield layer formed on the mold compound; and one or more vias extending vertically through the shield layer and the mold compound, providing a conductive path to the RF transceiver. In another embodiment, a method comprises: attaching a radio frequency (RF) transceiver to a substrate; encapsulating the substrate with mold compound; forming a shield layer on the mold compound; and forming one or more vias through the shield layer and mold compound, providing a conductive path to the RF transceiver.

8 Claims, 6 Drawing Sheets

ANTENNA ON INTEGRATED CIRCUIT PACKAGE

TECHNICAL FIELD

The subject matter of this disclosure relates generally to adding an antenna to an integrated circuit (IC) package.

BACKGROUND

A system-in-package (SiP) is a number of integrated circuit die enclosed in a single package that perform some or all the functions of an electronic system. It is sometimes desirable to integrate an external antenna with a SiP to support certain applications.

SUMMARY

An antenna on integrated circuit (IC) package is disclosed. The package allows freedom to design and customize an antenna for a given application or performance criteria and also leverage an existing manufacturing infrastructure (e.g., PoP techniques) to connect the antenna to the top of the package in a final application assembly. The package allows a customized antenna and matching or filtering components to be added externally to a fully shielded SiP post testing and assembly. Moreover, the antenna can be integrated with the SiP without increasing the footprint of a substrate of the SiP.

In an embodiment, an IC package comprises: a substrate; a radio frequency (RF) transceiver attached to the substrate; mold compound encapsulating the substrate; a shield layer formed on the mold compound; and one or more vias extending vertically through the shield layer and the mold compound, providing a conductive path to the RF transceiver.

In another embodiment, a method comprises: attaching a radio frequency (RF) transceiver to a substrate; encapsulating the substrate with mold compound; forming a shield layer on the mold compound; and forming one or more vias through the shield layer and mold compound, providing a conductive path to the RF transceiver.

In another embodiment, an integrated circuit (IC) package comprises: a substrate; a radio frequency (RF) transceiver attached to the substrate; a surface mount discrete attached to the substrate and coupled to the RF transceiver; mold compound encapsulating the substrate; a shield layer formed on the mold compound; and an opening extending vertically through the shield layer and the mold compound, the opening exposing a portion of the surface mount discrete.

In another embodiment, a method comprises: attaching a radio frequency (RF) transceiver to a substrate; attaching a surface-mount device to the substrate; coupling the surface-mount device to the RF receiver; encapsulating the substrate with mold compound; forming a shield layer on the mold compound; and removing a portion of the shield layer to expose a portion of the surface-mount device.

DETAILED DESCRIPTION

Figure 1:
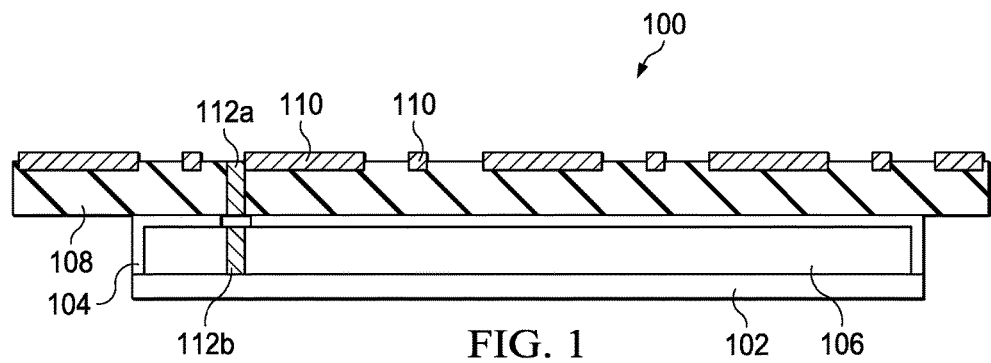
FIG. 1 is a side view of an example antenna on package, according to an embodiment.

A SiP is fabricated by combining one or more IC dies and possibly other electronic discrete components and logic on a common substrate, encapsulating the substrate with mold compound and forming an electromagnetic interference (EMI) shield over the mold compound to prevent or reduce RF transmissions from the SiP.

In an embodiment, one or more opening(s) are formed on a top surface of a molded and fully shielded SiP, creating via(s) that extend vertically through the EMI shield and mold compound to access the substrate. An antenna is formed on or affixed to a top side of the SiP and is coupled to the via(s) to allow electrical connection(s) with pad(s)/terminal(s) of an IC die attached on the substrate. In an embodiment, matching or filtering components for the antenna can be affixed or formed on the top surface of the SiP post testing and assembly to improve the performance of the antenna for a particular application.

In an embodiment, a SiP is fabricated by attaching (e.g., soldering) one or more metal post(s) on an substrate and encapsulating the substrate with mold compound so that the top(s) of the one or more posts(s) are substantially flush with the top side of the mold compound. A laser is used to ablate a portion of an EMI shield to expose the top side(s) of the post(s) to allow connection of an antenna formed on or affixed to the top side of the SiP.

In another embodiment, a mold press is used to form vias in the mold compound and a laser is applied to ablate the remaining residue to expose pads/terminals on the substrate.

In another embodiment, a conductive surface mount discrete (SMD) type component (e.g., 0805 2 terminal SMD) is attached on a substrate and is configured to extend vertically through the mold compound and have its top side substantially flush with the top side of the mold compound. The top side of the SMD component can be exposed by removing a portion of the EMI shield with a laser.

In some embodiments, an antenna is included on a flex circuit or rigid PCB structure that can be affixed to the SiP at a later stage in the fabrication process similar to Package-on-Package (PoP) assembly. The antenna can be custom designed (e.g., a dipole antenna, "inverter-F" antenna) based on the application or desired performance. The antenna routing can be routed away from the EMI shield on the SiP. Matching or filtering components for the antenna can be included on the flex circuit or rigid PCB structure. The thickness and dielectric constant of the flex circuit or rigid PCB structure can be customized for a specific application or performance criteria. A via can be formed in the PCB structure, which can be aligned with the via extending through the EMI shield and mold compound during SiP assembly.

Particular embodiments disclosed herein provide one or more advantages, including but not limited to: allowing a high efficiency antenna to be integrated with a SiP, allowing a small footprint for an integrated solution, allowing independent testing of the SiP and the RF connections for an antenna before antenna integration, allowing simplified access for conductive testing of the SiP in production flow and the capability to connect a rigid or flexible PCB structure according to a desired RF transceiver performance for a given industrial design.

Example Antenna on Package

FIG. 1 is a side view of an example antenna on package, according to an embodiment. In the example shown, SiP 100 includes substrate 102, EMI shield 104, mold compound 106, PCB structure 108 and antenna conductor 110. EMI shield 104 can be sputter coated or plated on the molded SiP 100. Antenna conductor 110 is coupled to via 112a through an exposed opening in the top side of molded SiP 100. In an embodiment, via 112a extends vertically through PCB structure 108. Via 112b extends from the top of EMI shield 104 throughmold compound 106 and down to substrate 102 where it electrically connects with one or more pads or terminals of an IC die (not shown) attached to substrate 102. Vias 112a, 112b can be metal plated to provide a conductive path to the pads/terminals. The pads/terminals are coupled to an integrated circuit die (not shown) attached to substrate 102, such as an RF transceiver die. PCB structure 108 can be affixed to the top side of SiP 100 using solder or other attachment method. As described in reference to FIG. 7, in an embodiment via 112b can be formed by attaching an interconnect SMD component (e.g., 0805 2 terminal SMD component) to substrate 102 during assembly that has a height such that the SMD component is substantially flush with the top surface of the mold compound 106. A laser can then be used to ablate a portion of EMI shield 104 to expose the top side of the SMD component that is substantially flush with the mold compound 106 to allow connection to antenna conductor 110.

Antenna conductor 110 can be affixed to SiP 100 after SiP 100 is fully assembled, tested and certified. This allows antenna conductor 110 (and optionally matching components or filters) to be added post assembly and testing to tailor the SiP 100 to a specific application or performance criteria. Various antenna designs can be used based on the desired performance or application, as described in reference to FIGS. 4A, 4B, 5A and 5B.

Figure 2:
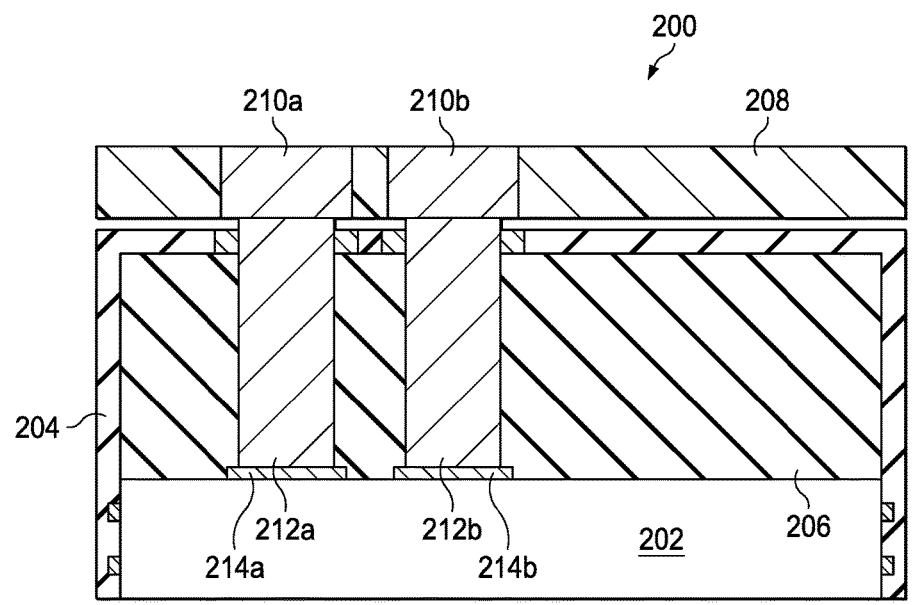
FIG. 2 is a side view of an alternative example antenna on package including posts for connecting the antenna to radio frequency (RF) terminals on a substrate, according to an embodiment.

FIG. 2 is a side view of an alternative example antenna on package design including posts for connecting the antenna to pad/terminals on a substrate of a SiP, according to an embodiment. In this example embodiment, SiP 200 includes substrate 202, EMI shield 204, mold compound 206, PCB structure 208, vias 210a, 210b and posts 212a, 212b. An antenna (not shown) can be printed on PCB structure 208 (e.g., a PCB) and its terminals can be connected to vias 210a, 210b, which extend vertically through mold compound 206 to substrate 102. Posts 212a, 212b electrically connect vias 210a, 210b to pads/terminals 214a, 214b of an IC die (not shown) attached to substrate 202. The embodiment of FIG. 2 allows for a differential connection of an antenna conductor using two vias 210a, 210b.

Figure 3A:
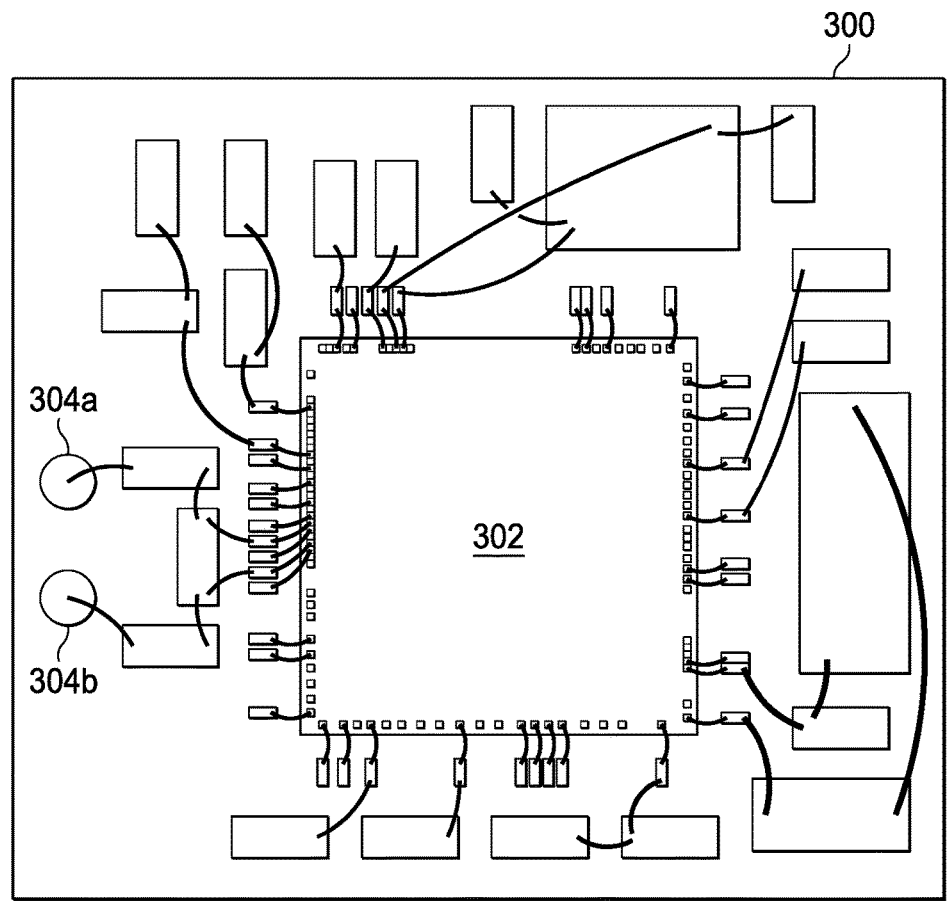
FIG. 3A is a top view of RF terminal locations on a substrate, according to an embodiment.
Figure 3B:
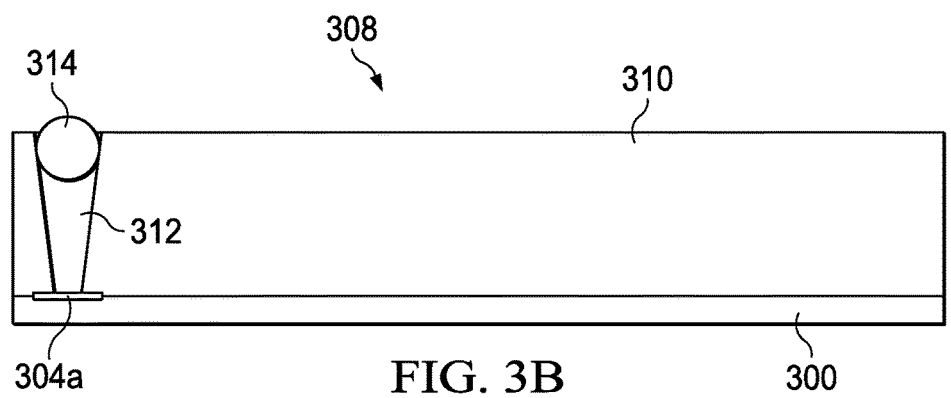
FIG. 3B is a side view of a molded package with vias formed in the package to access an RF terminal at an RF terminal location on a substrate, according to an embodiment.

FIG. 3A is a top view of RF terminals 304a, 304b on a substrate 300, according to an embodiment. In the example embodiment shown, substrate 300 includes IC die 302 and various other discrete components and logic. RF terminal 304a, 304b are coupled to vias which are exposed on the top side of the SiP and extend vertically through the mold compound 310, as described in reference to FIG. 1. FIG. 3B is a side view of molded SiP 308 with via 312 laser drilled through mold compound 310 and filled with conductive ball 314. Via 312 can be formed using known PoP via formation technologies. Via 312 extends vertically through mold compound 310 and connects to RF terminal 304a (e.g., a J6 pad). RF terminal 304 is connected to, for example, IC die 302. In another embodiment, via 304a can be created by soldering a metal pin to substrate 302, which extends vertically through mold compound to the top side of SiP 308.

Figure 4A:
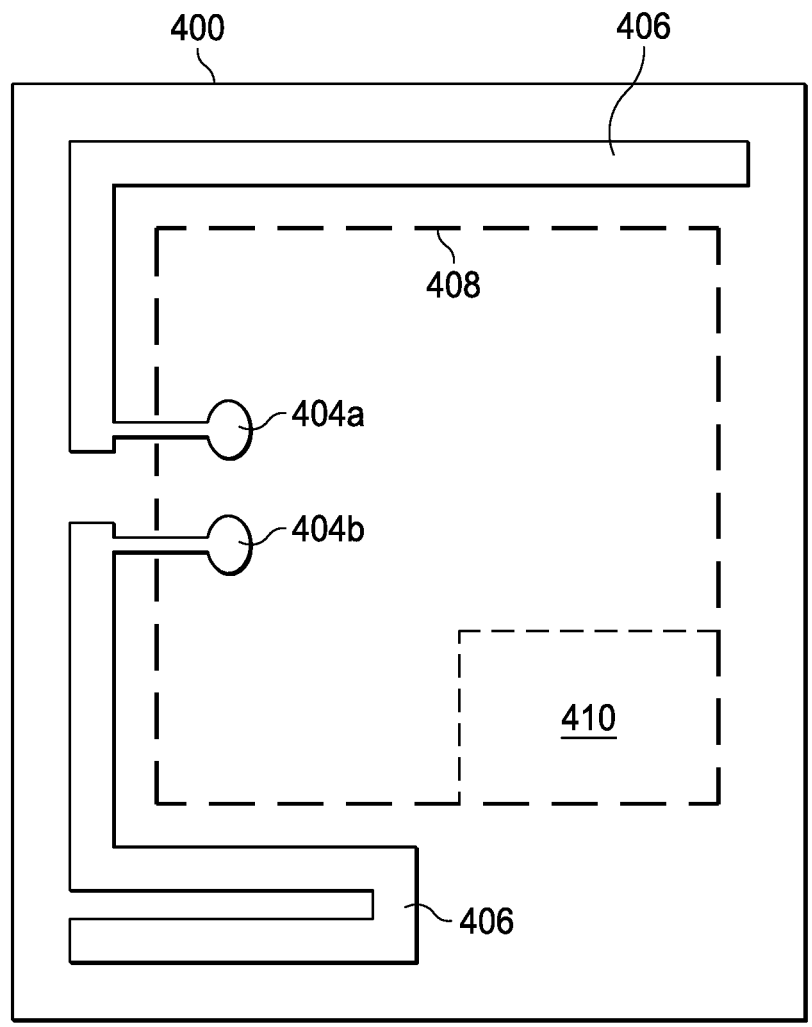
FIG. 4A is a top view of a dipole antenna on a SiP, according to an embodiment.
Figure 4B:
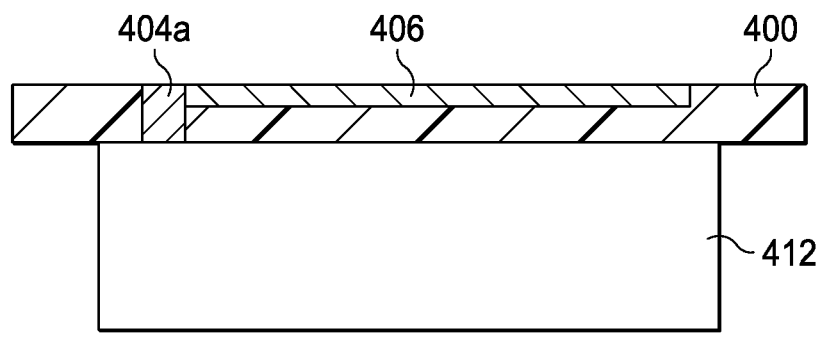
FIG. 4B is a side view of a dipole antenna on a SiP, according to an embodiment.

FIG. 4A is a top view of dipole antenna 406 that can be attached to a SiP, according to an embodiment. Dipole antenna 406 is formed on a rigid or flexible PCB structure 400 that overhangs SiP 412 when affixed to SiP 412, as shown in FIG. 4B. Dipole antenna 406 is electrically connected to exposed vias 404a, 404b. In an embodiment, the routing for antenna 406 is outside a perimeter 408 of SiP 412 away from the EMI shield (See FIG. 1). The routing for antenna 406 has the flexibility to avoid attachment area 410, which may include a component that could adversely affect the performance of dipole antenna 406, such as a crystal oscillator that may detune antenna 406. FIG. 4B is a side view of dipole antenna 406 implemented on SiP 412, according to an embodiment. Note that PCB structure 400 overhangs SiP 412 to route antenna 406 away from the EMI shield.

Figure 5A:
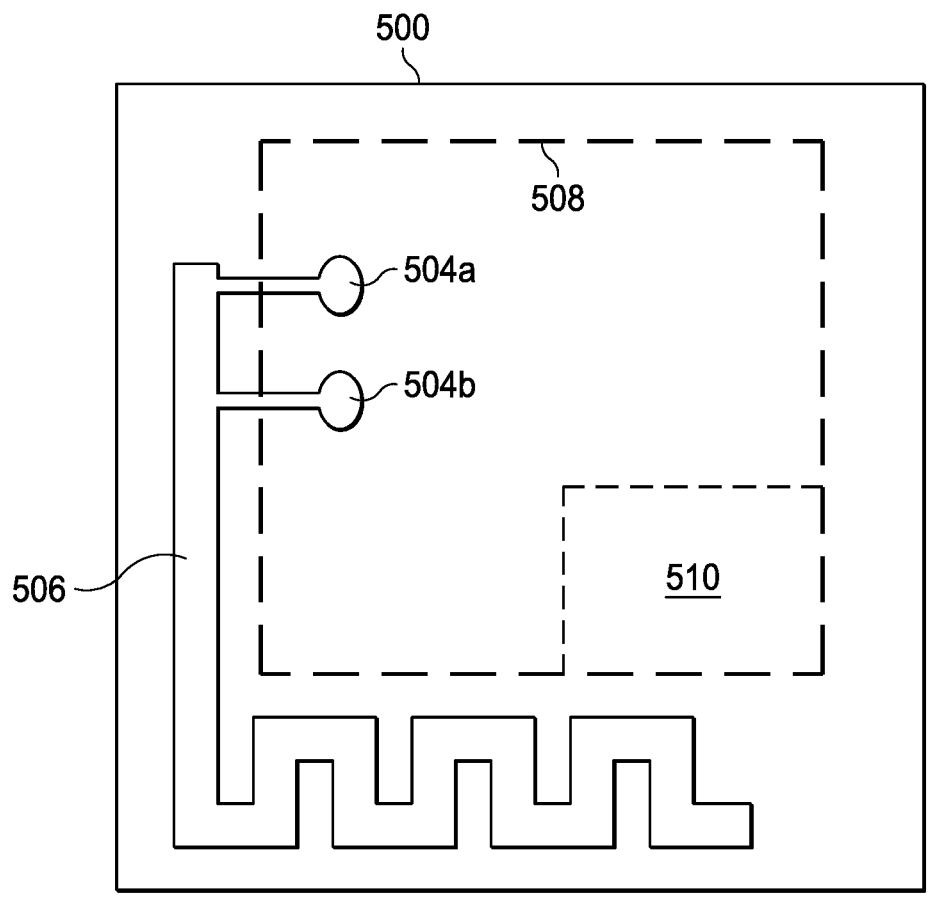
FIG. 5A is a top view of an "inverted-F" type antenna on a SiP, according to an embodiment.
Figure 5B:
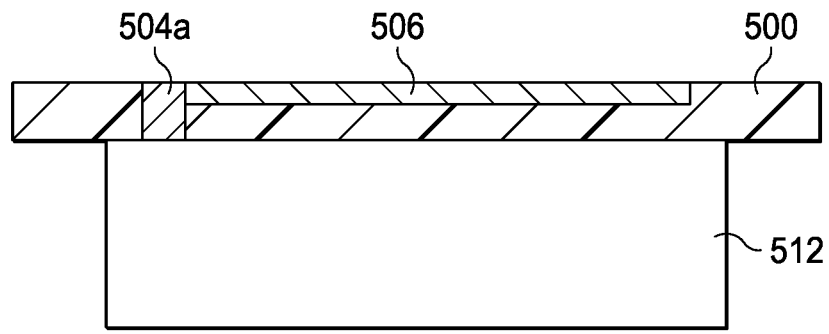
FIG. 5B is a side view of an "inverted-F" type antenna on a SiP, according to an embodiment.

FIG. 5A is a top view of an "inverted-F" type antenna implemented on a SiP, according to an embodiment. "Inverted-F" type antenna 506 is formed on a rigid or flexible PCB structure 500 that overhangs SiP 512 when affixed to SiP 512, as shown in FIG. 5B. "Inverted-F" type antenna 506 is electrically connected to exposed vias 504a, 504b. In an embodiment, the routing for antenna 506 is outside a perimeter 508 of SiP 412 away from the EMI shield (See FIG. 1). The routing for antenna 506 has the flexibility to avoid attachment area 510, which may include a component that could adversely affect the performance of "inverted-F" type antenna 506, such as a crystal oscillator that may detune antenna 506. FIG. 5B is a side view of an "inverted-F" antenna 506 implemented on SiP 512, according to an embodiment. Note that PCB structure 500 overhangs SiP 512 to route antenna 506 away from the EMI shield.

Figure 6A:
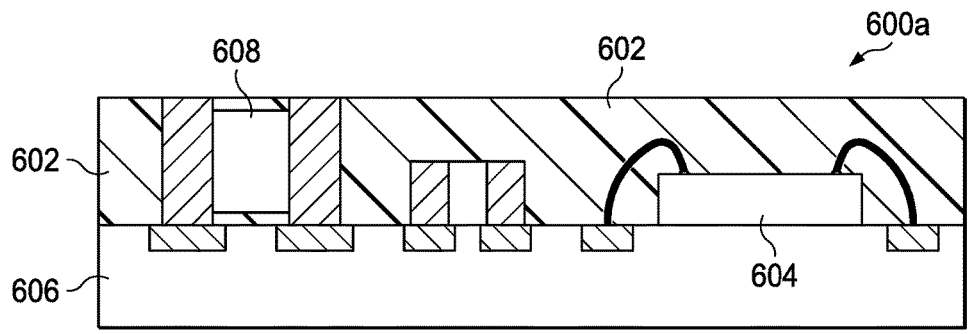
FIG. 6A is a side view of an antenna on package with a surface mount discrete (SMD) component, according to an embodiment.

FIG. 6A is a side view of an antenna on package with an SMD type component, according to an embodiment. In the example shown, SiP 600a includes substrate 606. Attached to substrate 606 is IC die 604 and possibly other IC die, discrete electronic components and logic. SMD type component 608 is attached to substrate 606 and is exposed at the top side of mold compound 602 for external connection to an antenna. This configuration has a low material cost and does not require any additional process steps as the SMD component is attached to substrate 606 during the SiP assembly process.

Figure 6B:
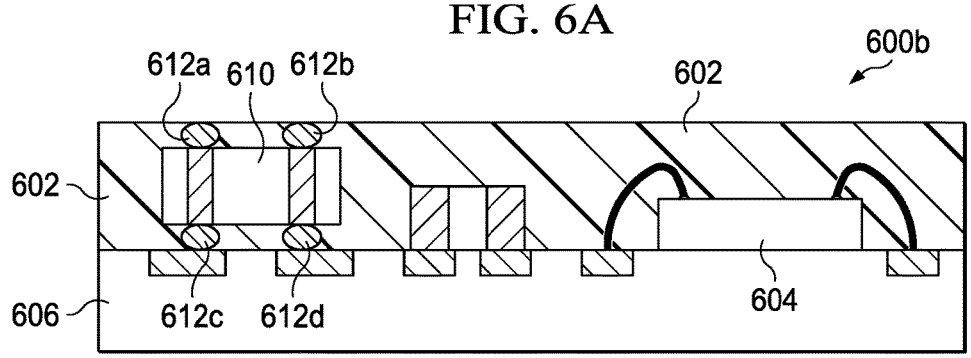
FIG. 6B is a side view of an antenna on package with a ball grid array (BGA) printed circuit board (PCB) interposer and top and bottom side balls, according to an embodiment.

FIG. 6B is a side view of an antenna on package with a ball grid array (BGA) printed circuit board (PCB) interposer (balls on both top and bottom sides), according to an embodiment. In the example shown, SiP 600b includes PCB interposer 610 with balls 612a-612d attached to top and bottom sides of PCB interposer 610. PCB interposer 610 is attached on substrate 600. Top side balls 612a, 612b are exposed at the top surface of mold compound 602 for external connection to an antenna. This configuration has a lower cost than laser drilling and fill processes.

Figure 6C:
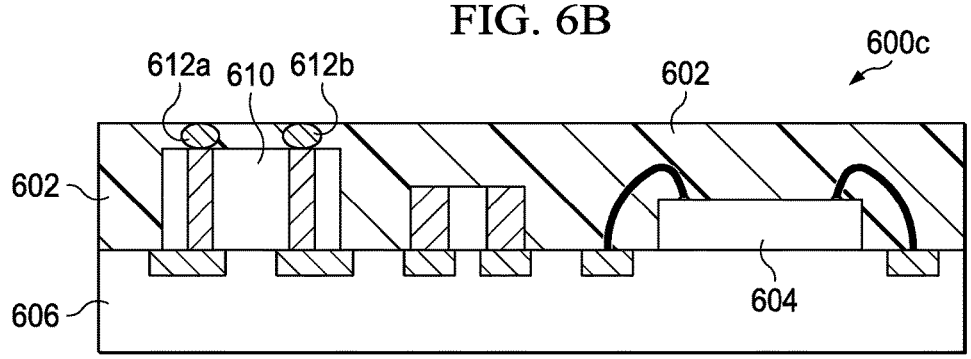
FIG. 6C is a side view of an antenna on package with a BGA PCB interposer and top side balls only, according to an embodiment.

FIG. 6C is a side view of an antenna on package with a BGA PCB interposer (top side balls only), according to an embodiment. In the example shown, SiP 600c includes PCB interposer 610 with balls 612a, 612b attached to the top side of PCB interposer 610. PCB interposer 610 is attached on substrate 600. Top side balls 612a, 612b are exposed at the top surface of mold compound 602 for external connection to an antenna. This configuration has a lower cost than laser drilling and fill processes.

Figure 6D:
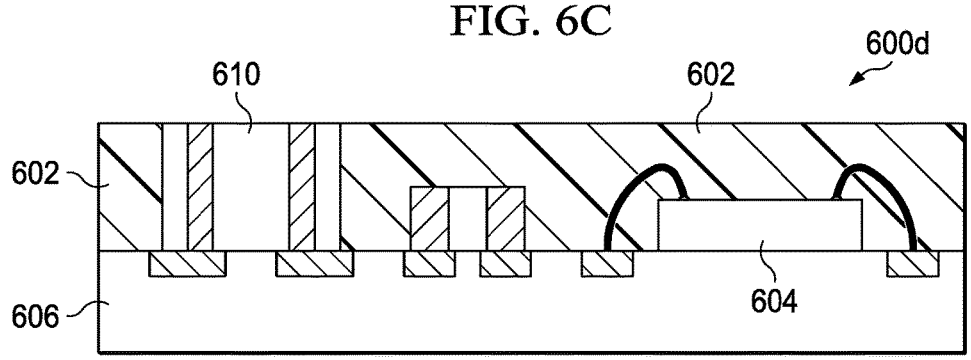
FIG. 6D is a side view of an antenna on package with a land grid array (LGA) PCB interposer, according to an embodiment.

FIG. 6D is a side view of an antenna on package with a land grid array (LGA) PCB interposer, according to an embodiment. In the example shown, SiP 600d includes PCB interposer 610 without balls. PCB interposer 610 is attached on substrate 600. The top side of PCB interposer 610 is exposed at the top surface of mold compound 602 for external connection to an antenna. This configuration has a lower cost than laser drilling and fill processes.

Figure 7:
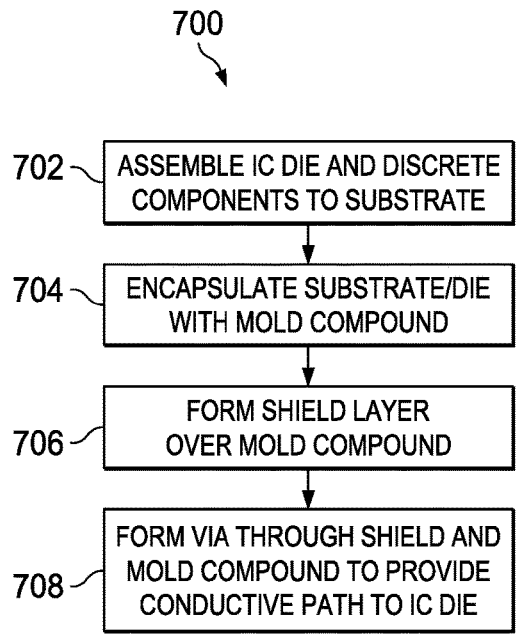
FIG. 7 is a flow diagram of an example process for fabricating an antenna on package, according to an embodiment.

FIG. 7 is a flow diagram of an example process 700 for fabricating an antenna on package, according to an embodiment. Process 700 can begin by assembling IC die and discrete components to a substrate (702). Process 700 can continue by encapsulating the substrate and IC die with mold compound (704). Process 700 can continue by forming an EMI shield over the mold compound (706). Process 700 can continue by forming a via through the EMI shield and mold compound, providing a conductive path to the IC die. An opening of the via can be exposed by ablating a portion of the EMI shield with a laser. In an embodiment, the via extends vertically through the mold compound to access the substrate. The via provides part of a conductive path from an antenna to an IC die attached on the substrate (e.g., an RF transceiver die).

Figure 8:
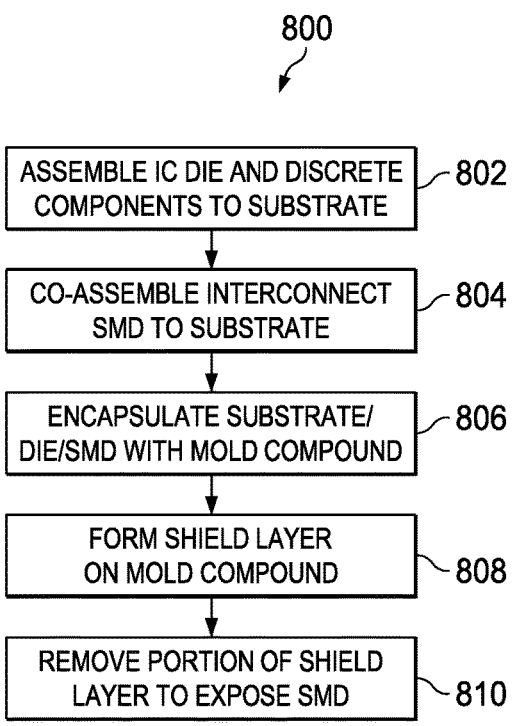
FIG. 8 is a flow diagram of an alternative example process for fabricating an antenna on package, according to an embodiment.

FIG. 8 is a flow diagram of another example process 800 for fabricating an antenna on package, according to an embodiment. Process 800 can begin by assembling IC die and discrete components to a substrate (802). Process 800 can continue by co-assembling interconnect SMD to the substrate (804). Process 800 can continue by encapsulating the substrate, IC die and SMD type component with mold compound (806). Process 800 can continue by forming an EMI shield on the mold compound (808). Process 800 can continue by removing a portion of the EMI shield to expose the top side of the SMD component (810). The SMD type component extends vertically through the mold compound to access the substrate. The SMD type component provides part of a conductive path from an antenna affixed to the SiP to an IC die attached on the substrate (e.g., an RF transceiver die).

While this document contains many specific implementation details, these should not be construed as limitations on the scope of what may be claimed but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. An integrated circuit (IC) package comprising:
   a substrate;
   a radio frequency (RF) transceiver attached to the substrate;
   mold compound encapsulating the RF transceiver;
   an electromagnetic interference (EMI) shield layer formed over the mold compound to provide at least a portion of an outer surface of the package; and
   one or more vias extending vertically through the EMI shield layer and the mold compound, providing a conductive path to the RF transceiver.

2. The IC package of claim 1, further comprising:
   a printed circuit board (PCB) structure attached to the EMI shield layer and coupled to the via.

3. A method of fabricating an integrated circuit (IC) package, comprising:
   attaching a radio frequency (RF) transceiver to a substrate;
   encapsulating the RF transceiver with mold compound;
   forming an electromagnetic interference (EMI) shield layer over the mold compound to provide at least a portion of an outer surface of the package; and
   forming one or more vias through the EMI shield layer and mold compound, providing a conductive path to the RF transceiver.

4. The method of claim 3, further comprising:
   attaching a printed circuit board (PCB) structure to the EMI shield layer and coupling the PCB to the one or more vias.

5. An integrated circuit (IC) package comprising:
   a substrate;
   a radio frequency (RF) transceiver attached to the substrate;
   a surface mount discrete component attached to the substrate and coupled to the RF transceiver;
   mold compound encapsulating the surface mount discrete component;
   an electromagnetic interference (EMI) shield layer formed over the mold compound to provide at least a portion of an outer surface of the package; and
   an opening extending vertically through the EMI shield layer and the mold compound, the opening exposing a portion of the surface mount discrete component.

6. The IC package of claim 5, further comprising:
   an printed circuit board (PCB) structure attached to the EMI shield layer and coupled to the surface mount discrete component; and
   an antenna formed on or affixed to the PCB structure.

7. A method of fabricating an integrated circuit (IC) package, comprising:
   attaching a radio frequency (RF) transceiver to a substrate;

attaching a surface-mount device to the substrate;
coupling the surface-mount device to the RF receiver;
encapsulating the RF transceiver and surface-mount device with mold compound;
forming an electromagnetic interference (EMI) shield layer over the mold compound to provide at least a portion of an outer surface of the package; and
removing a portion of the EMI shield layer to expose a portion of the surface-mount device.

8. The method of claim 7, further comprising:
attaching an antenna to the surface-mount device.

* * * * *